(12) United States Patent
Mun

(10) Patent No.: US 9,337,353 B2
(45) Date of Patent: May 10, 2016

(54) SEMICONDUCTOR DEVICE AND METHOD FOR FABRICATING THE SAME

(71) Applicant: SK hynix Inc., Gyeonggi-do (KR)

(72) Inventor: Kyung-Sik Mun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/825,801

(22) Filed: Aug. 13, 2015

(65) Prior Publication Data

US 2015/0348992 A1 Dec. 3, 2015

Related U.S. Application Data

(62) Division of application No. 14/159,226, filed on Jan. 20, 2014, now Pat. No. 9,142,684.

(30) Foreign Application Priority Data

Oct. 29, 2013 (KR) .................. 10-2013-0129315

(51) Int. Cl.
| | |
|---|---|
| H01L 21/28 | (2006.01) |
| H01L 29/792 | (2006.01) |
| H01L 29/66 | (2006.01) |
| H01L 21/76 | (2006.01) |
| H01L 27/115 | (2006.01) |
| H01L 21/02 | (2006.01) |
| H01L 21/311 | (2006.01) |
| H01L 21/3213 | (2006.01) |

(52) U.S. Cl.
CPC .......... *H01L 29/792* (2013.01); *H01L 21/0223* (2013.01); *H01L 21/28282* (2013.01); *H01L 21/31105* (2013.01); *H01L 21/3213* (2013.01); *H01L 21/76* (2013.01); *H01L 27/1157* (2013.01); *H01L 27/11578* (2013.01); *H01L 27/11582* (2013.01); *H01L 29/66833* (2013.01); *H01L 29/7926* (2013.01); *H01L 21/02255* (2013.01); *H01L 27/11565* (2013.01)

(58) Field of Classification Search
CPC .................. H01L 21/0233; H01L 21/28282; H01L 27/11582
See application file for complete search history.

(56) References Cited

U.S. PATENT DOCUMENTS

2014/0264547 A1* 9/2014 Kawai ............... H01L 29/66833
257/324

* cited by examiner

*Primary Examiner* — Tran Tran
(74) *Attorney, Agent, or Firm* — IP & T Group LLP

(57) ABSTRACT

A semiconductor device and a method of manufacturing the same. The semiconductor device includes a channel, a gate, and a memory layer is interposed between the channel and the gate. The memory layer includes a tunnel insulating layer adjacent to the channel, a charge blocking layer adjacent to the gate, and a charge storing layer interposed between the tunnel insulating layer and the charge blocking layer. The tunnel insulating layer includes a first insulating layer adjacent to the channel and an air layer interposed between the first insulating layer and the charge storing layer.

9 Claims, 10 Drawing Sheets

SEMICONDUCTOR DEVICE AND METHOD FOR FABRICATING THE SAME

CROSS-REFERENCE TO RELATED APPLICATIONS

This application is a division of U.S. patent application Ser. No. 14/159,226 filed on Jan. 20, 2014, which claims priority of Korean Patent Application No. 10-2013-0129315, filed on Oct. 29, 2013. The disclosure of each of the foregoing application is incorporated herein by reference in its entirety.

BACKGROUND

1. Field

Exemplary embodiments of the present invention relate to a semiconductor device, and more particularly, to a semiconductor device including a plurality of memory cells stacked vertically from a substrate and a method for fabricating the same.

2. Description of the Related Art

A NAND flash memory is an example of a memory device, which may store data and maintain the stored data even though power supply is cut off.

Recently, the improvement in integration degree of a 2D semiconductor device in which memory cells are formed as a single layer over a silicon substrate has reached the limit. Thus, there have been proposed a variety of 3D semiconductor devices in which a plurality of memory cells are stacked vertically from a silicon substrate.

SUMMARY

Various embodiments are directed to a semiconductor device capable of securing the operation characteristic and the data retention characteristic of a memory cell and simplifying a fabrication process, and a method for fabricating the same.

In an embodiment, a semiconductor device may include a channel disposed over a substrate and extending in a direction substantially perpendicular to the substrate; a stacked structure comprising one or more interlayer dielectric layers and one or more gates that are alternatively stacked over the substrate; and a memory layer interposed between the channel and the one or more gates, the memory layer comprising a tunnel insulating layer adjacent to the channel, a charge blocking layer adjacent to the gate, and a charge storing layer interposed between the tunnel insulating layer and the charge blocking layer, wherein the tunnel insulating layer comprises a first insulating layer adjacent to the channel, and an air layer interposed between the first insulating layer and the charge storing layer.

In an embodiment, a semiconductor device may include a channel; a gate; and a memory layer interposed between the channel and the gate, the memory layer comprising a tunnel insulating layer adjacent to the channel, a charge blocking layer adjacent to the gate, and a charge storing layer interposed between the tunnel insulating layer and the charge blocking layer, wherein the tunnel insulating layer comprises a first insulating layer adjacent to the channel and an air layer interposed between the first insulating layer and the charge storing layer.

In an embodiment, a method for fabricating a semiconductor device may include: forming a stacked structure over a substrate, the stacked structure including a plurality of interlayer dielectric layers and a plurality of material layers, which are alternately stacked; selectively etching the stacked structure to form a first channel hole through the stacked structure; sequentially forming a charge blocking layer, a charge storing layer, a second sacrificial layer, and a first insulating layer on a sidewall defining the first channel hole; forming an air layer by removing the second sacrificial layer; and forming a channel in the first channel hole.

DETAILED DESCRIPTION

Figure 1A:
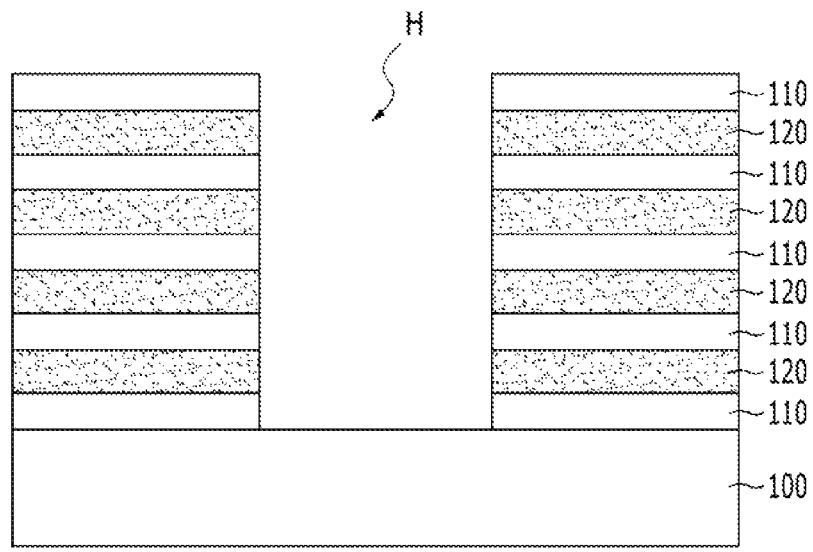
FIGS. 1A to 1F are cross-sectional views showing a semiconductor device and a method of fabricating the same in accordance with an embodiment of the present invention.
Figure 1B:
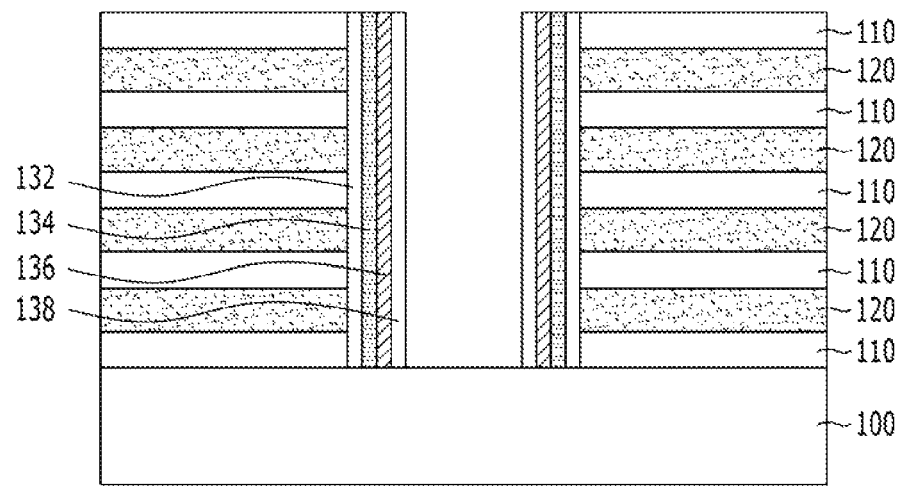

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIGS. 1A to 1F are cross-sectional views showing a semiconductor device and a method for fabricating the same accordance with an embodiment of the present invention.

First, the fabrication method will be described.

Referring to FIG. 1A, a plurality of interlayer dielectric layers 110 and a plurality of first sacrificial layers 120 may be alternately stacked over a substrate 100 in which required predetermined structures, for example, a source region and the like may be formed.

The first sacrificial layer 120 is a layer to be replaced with a conductive layer that is used as a gate of a memory cell during a subsequent process, and may be formed of a layer having a different etch rate from the interlayer dielectric layer 110, for example, an oxide layer. The interlayer dielectric layer 110 serves to insulate gates of memory cells, positioned at the top and bottom thereof, from each other and may be formed of an oxide layer, for example.

FIG. 1A illustrates four first sacrificial layers 120, but the present invention is not limited thereto. One or more first sacrificial layers 120 may be stacked, and the number of first sacrificial layers may be set based on desired characteristics.

The stacked structure of the interlayer dielectric layers 110 and the first sacrificial layers 120 may be selectively etched to form a channel hole H that exposes the substrate 100 through the stacked structure. The channel hole H may be formed to expose a source region that is formed in the substrate 100 and not illustrated in FIG. 1A.

Referring to FIG. 13, a charge blocking layer 132, a charge storing layer 134, a second sacrificial layer 136, and a first insulating layer 138 may be sequentially formed on the sidewall of the channel hole H.

The charge blocking layer 132 serves to block the transfer of charge between the gate of the memory cell and the charge storing layer 134, and may be formed of an oxide layer, for example, a silicon oxide layer. The charge storing layer 134 serves to store charges therein, and may be formed of a nitride layer capable of trapping charges, for example, a silicon nitride layer. The second sacrificial layer 136 is a layer that is removed to be air during a subsequent process, and may be formed of a layer that has a different etch rate from the charge blocking layer 132, the charge storing layer 134, and the first insulating layer 138. The second sacrificial layer 136 may be, for example, a carbon layer. The first insulating layer 138 may function as a tunnel insulating layer with air, and may be formed of an oxide layer, for example, a silicon oxide layer. The tunnel insulating layer may serve as a layer for tunneling charge between a channel and the charge storing layer 134.

The charge blocking layer 132, the charge storing layer 134, the second sacrificial layer 136, and the first insulating layer 138 may be formed by sequentially depositing an oxide layer, a nitride layer, a carbon layer, and an oxide layer on the resultant structure of FIG. 1A and performing a blanket etching process to expose the substrate 100 and the uppermost interlayer dielectric layer 110.

Alternatively, the charge blocking layer 132, the charge storing layer 134, the second sacrificial layer 136, and the first insulating layer 138 may be formed by sequentially performing a deposition process and a blanket etching process for an oxide layer, a deposition process and a blanket etching process for a nitride layer, a deposition process and a blanket etching process for a carbon layer, and a deposition process and a blanket etching process for an oxide.

Figure 1C:
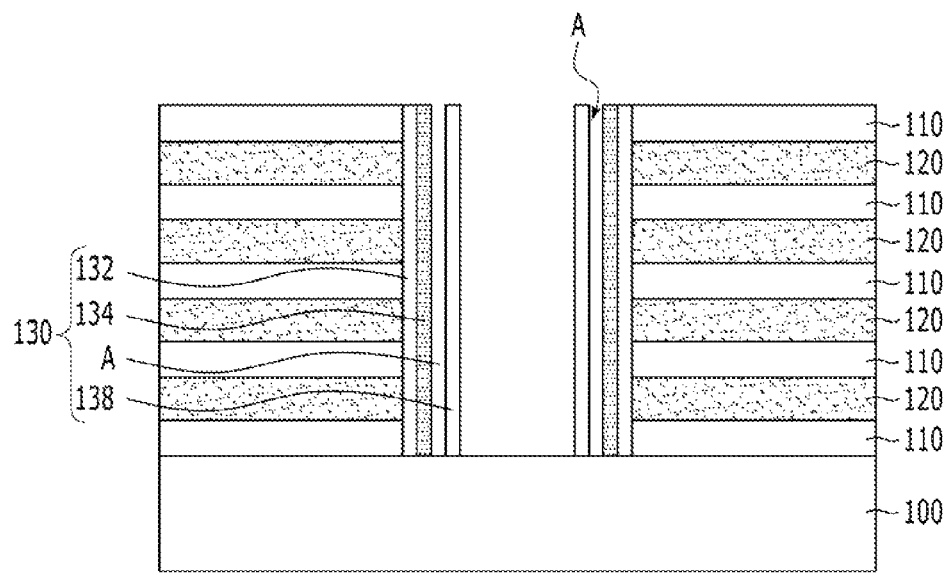

Referring to FIG. 1C, the second sacrificial layer 136 may be removed. Thus, the space may be formed by removing the second sacrificial layer 136. That is, the second sacrificial layer 136 may be the air layer A.

If the second sacrificial layer 136 is formed of a carbon layer, then the removal of the second sacrificial layer 136 may be performed using oxygen-containing plasma. If the oxygen-containing plasma, for example, $O_2$ plasma is implanted into the resultant structure of FIG. 1B, carbon of the second sacrificial layer 136 may react with oxygen and then escape as $CO_x$ gas. The $CO_x$ gas may escape through the opened top surface of the second sacrificial layer 136. Furthermore, if the first insulating layer 138 is formed of an oxide layer, which is not dense, the $CO_x$ gas may escape through the first insulating layer 138.

As the result of this process, a memory layer 130, in which the charge blocking layer 132, the charge storing layer 134, the air layer A, and the first insulating layer 138 are sequentially disposed, may be formed on the sidewall of the channel hole H. As described above, the air layer A and the first insulating layer 138 may function as a tunnel insulating layer in the memory layer 130.

Figure 1D:
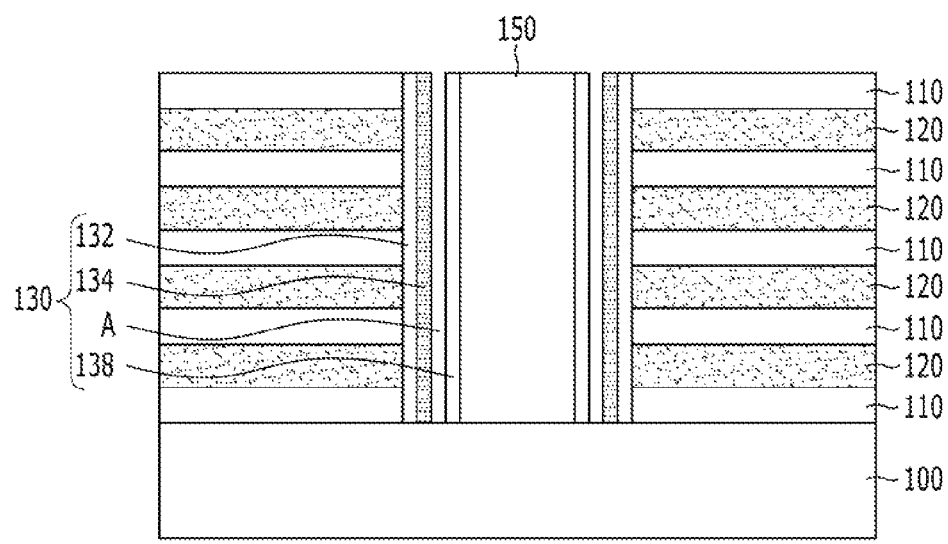

Referring to FIG. 1D, a semiconductor material, for example, polysilicon or the like, may be buried in the channel hole H having the memory layer 130 formed therein, thereby forming a channel 150. The channel 150 may have a pillar shape extending in a direction substantially perpendicular to the substrate 100. Furthermore, the channel 150 may be electrically coupled to the source region formed in the substrate 100.

The channel 150 may be formed by the following process by depositing a semiconductor material over the resultant structure of FIG. 1C to such a thickness as to sufficiently fill the channel hole H. The deposited semiconductor material is planarized, by, for example a chemical mechanical polishing (CMP) process, to expose the uppermost interlayer dielectric layer 110.

During the above-described channel formation process, the air layer A may be maintained. Since the air layer A has a very small width in a direction parallel to the substrate 100, the top of the air layer A may be blocked by the semiconductor material at the initial stage of the process of depositing the semiconductor material. Thus, at least the air layer A between the first sacrificial layer 120 and the channel 150 may be maintained. In particular, when the channel 150 is formed of a layer having a poor step coverage characteristic, the air layer A may be maintained more reliably.

Figure 1E:
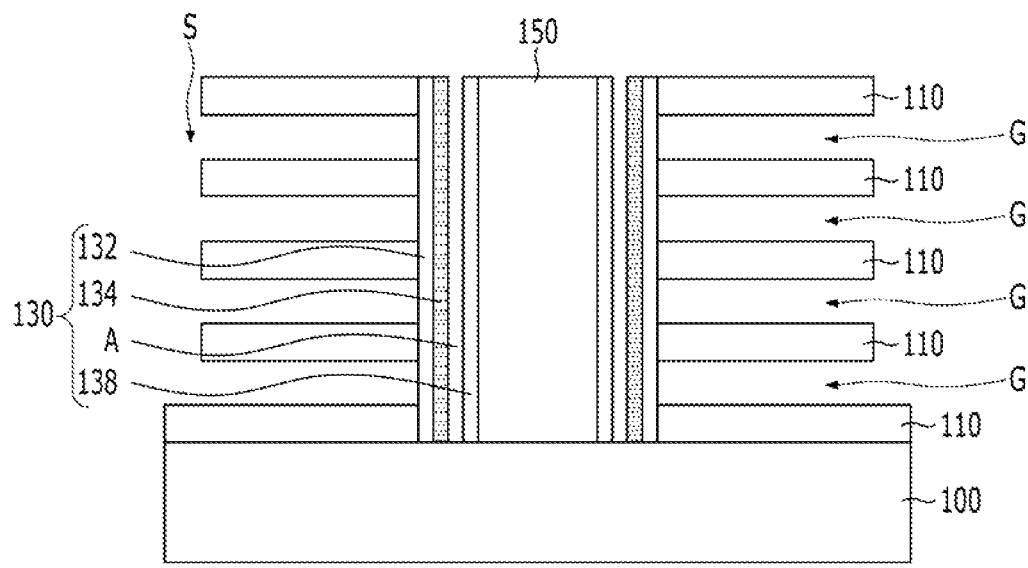

Referring to FIG. 1E, the stacked structure of the interlayer dielectric layer 110 and the first sacrificial layer 120 may be selectively etched to form a slit S in the stacked structure. The slit S may be formed to such a depth as to pass through at least the lowermost first sacrificial layer 120. Furthermore, the slit S may have various shapes. For example, the slit. S may have a line shape extended in a direction perpendicular to the cross-section of FIG. 1E, but the present invention is not limited thereto. The slit S may include any shape that may expose all of the first sacrificial layers 120.

The first sacrificial layer 120, exposed through the slit S, may be removed. A space created by removing the first sacrificial layers 120 may be referred to as a groove G. The removal of the first sacrificial layer 120 may be performed through a wet or dry etching process. When the first sacrificial layer 120 is removed, the top to surfaces of the channel layer 150 and the memory layer 130 may be may be covered and protected by a protective layer (not illustrated).

Figure 1F:
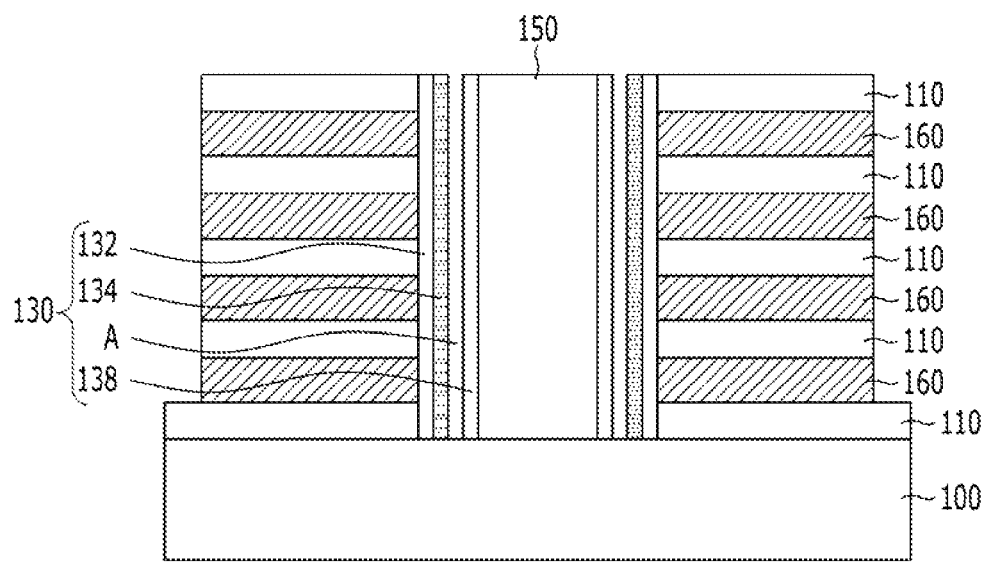

Referring to FIG. 1F, the groove G may be filled with a conductive material to form a gate 160 of a memory cell. The gate 160 may be formed of various conductive materials including: metal, metal nitride, polysilicon doped with an impurity or a combination thereof.

Although not illustrated, a required subsequent process, for example, a process for forming a bit line coupled to the top of the channel 150 may be performed, Through the above-described process, the exemplary semiconductor device, as illustrated in FIG. 1F, may be fabricated.

Referring to FIG. 1F, the semiconductor device in accordance with the embodiment of the present invention may include the channel 150 extending in a direction substantially perpendicular to the substrate 100, the stacked structure in which the plurality of interlayer dielectric layers 110 and a plurality of gates 160 are alternately stacked over the substrate 100, and the memory layer 130 interposed between the stacked structure and the channel 150. Thus, the memory layer 130 may have a pillar shape extending in the direction substantially perpendicular to the substrate. When seen from the top, the memory layer 130 may have a shape to surround the channel 150.

In the present embodiment, the memory layer 130 may include the charge blocking layer 132, the charge storing layer 134, the air layer A, and the first insulating layer 138, which are sequentially disposed from the side closest to the stacked structure.

One channel 150, one gate 160 contacted with the channel 150 with the memory layer 130 interposed therebetween, and the memory layer 130 may form one memory cell. Depending on whether charges are injected into the charge storing layer 134 of the memory layer 130 from the channel 150 or discharged from the charge storing layer 134 according to a voltage applied to the gate 160 of the memory cell, data may be stored in the memory cell or erased from the memory cell such that the memory cell has a different state.

More specifically, an erase operation for erasing data of a memory cell may be performed by a method of tunneling and injecting holes into the charge storing layer 134 from the channel 150 and/or a de-trap method of de-trapping electrons of the charge storing layer 134 to the channel 150. A program operation for storing data into a memory cell may be performed by transferring electrons/holes in the opposite direction of the erase operation. In particular, the program operation may be performed by an incremental step pulse program (ISPP) method in which an incremental program voltage is applied to the gate 160 so as to inject a small amount of electrons at a time.

The effect that may be obtained when the air layer A and the first insulating layer 138 are used as the tunnel insulating layer will be described below with reference to FIGS. 2 to 4.

In the present embodiment, it has been described that the memory layer 130 has a shape that extends along the sidewall of the channel 150 in the direction perpendicular to the substrate 100, but the present invention is not limited thereto. The memory layer 130 may be formed in various shapes, as long as the memory layer 130 is interposed between the gate 160 and the channel 150.

Furthermore, it has been described that the first sacrificial layer 120 is replaced with the gate 160, but the present invention is not limited thereto. In another embodiment, a conductive layer may be directly deposited instead of the first sacrificial layer 120. That is, during the process of FIG. 1A, the first sacrificial layer 120 may be replaced with a conductive layer. In this case, the processes of FIGS. 1E and 1F may be omitted.

Figure 2:
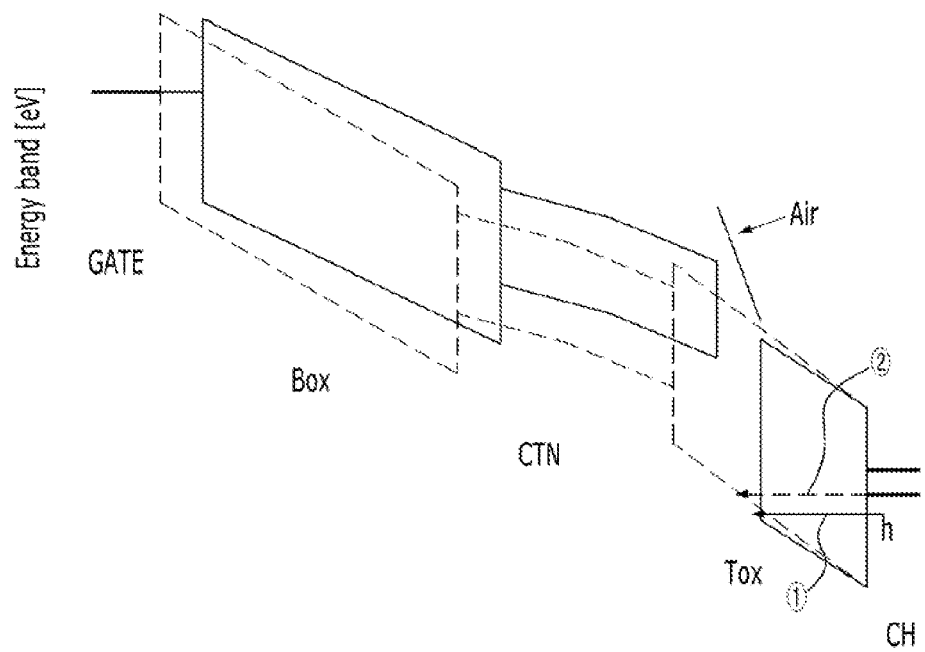
FIG. 2 is a diagram illustrating an energy band of a memory cell in accordance with the embodiment of the present invention and an energy band of a memory cell in accordance with a first comparative example.

FIG. 2 is a diagram illustrating an energy band of the memory cell in accordance with the embodiment of the present invention and an energy band of a memory cell in accordance with a first comparative example. The energy band of the memory cell in accordance with the embodiment of the present invention is indicated by a thin solid line. The energy band of the memory cell in accordance with the first comparative example is indicated by a dotted line, and an overlapping portion therebetween is indicated by a thick solid line. Furthermore, in FIG. 2, the gate, the charge blocking layer, the charge storing layer, the tunnel insulating layer, and the channel of each memory cell are represented by Gate, Box, CTN, Tox, and CH, respectively.

FIG. 2 illustrates a case in which the memory cell in accordance with the exemplary implementation of the present invention uses an oxide layer as the charge blocking layer Box, a nitride layer as the charge storing layer CTN, and an air layer and an oxide layer as the tunnel insulating layer Tox. In contrast, the memory cell in accordance with the first comparative example uses only an oxide layer having the same thickness, as the tunnel insulating layer Tox. In other words, the thickness of the tunnel insulating layer Tox in accordance with the present embodiment, that is, the sum of the air layer and the oxide layer is equal to the thickness of the tunnel insulating layer Tox of the memory cell in accordance with the first comparative example, that is, the thickness of the oxide layer. At this time, the thickness may indicate a width in a direction parallel to the substrate 100 in FIGS. 1A to 1F.

Furthermore, the thickness of the tunnel insulating layer Tox in accordance with the present embodiment may be set to such a thickness that direct tunneling of charges does not occur, for example, about 20 Å or more. If the thickness of the tunnel insulating layer Tox is so small that direct tunneling of charges occurs, then a program operation based on the ISPP method cannot be performed, and a data retention characteristic of the memory cell may be degraded. Thus, the thicknesses of the air layer and the oxide layer in the tunnel insulating layer Tox in accordance with the present embodiment may be suitably adjusted. For example, the thickness of the air may be set to about 10 Å, and the thickness of the oxide layer may be set to about 25 Å.

Referring to FIG. 2, it can be seen that, during the erase operation, a tunnel barrier width ① from the channel CH to the charge storing layer CTN in the memory cell in accordance with the present exemplary embodiment is smaller than a tunnel barrier width ② from the channel CH to the charge storing layer CTN in the memory cell in accordance with the first comparative example.

Thus, in the memory cell in accordance with the present embodiment, a large amount of holes h may be injected into the charge storing layer CTN within a short time, compared to the memory cell in accordance with the first comparative example. Thus, the erase speed may be significantly improved.

Figure 3:
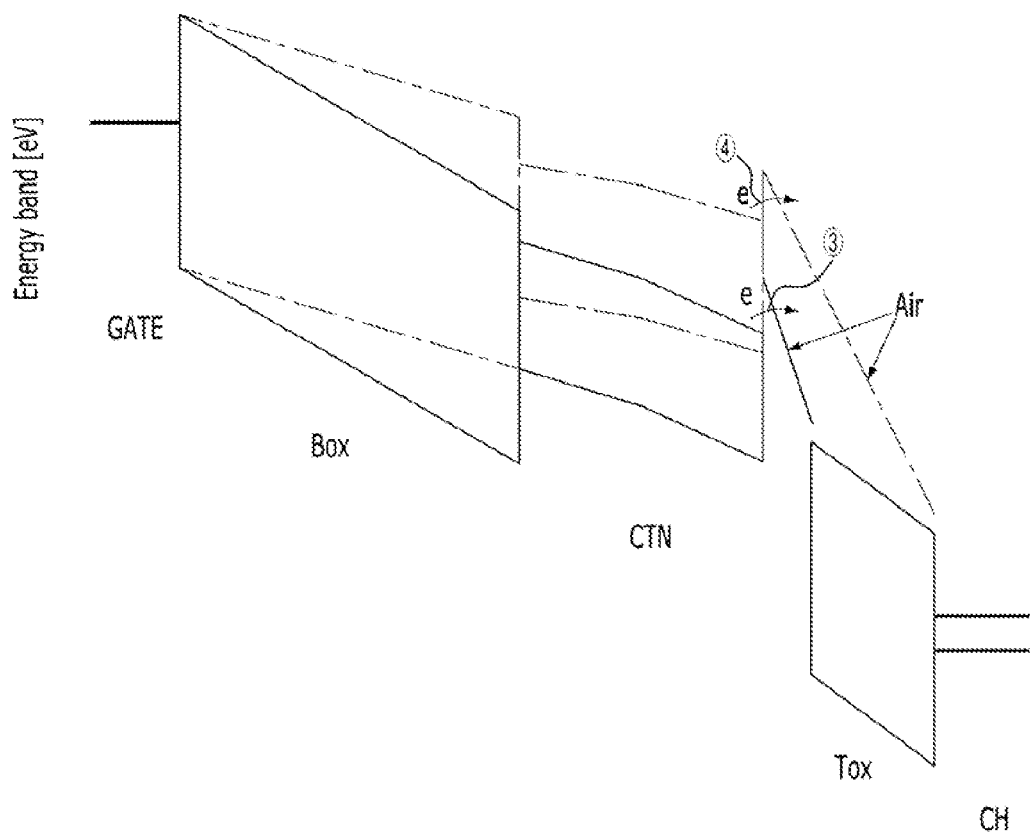
FIG. 3 is a diagram illustrating the energy band of the memory cell in accordance with the embodiment of the present invention and an energy band of a memory cell in accordance with a second comparative example.

FIG. 3 is a diagram illustrating the energy band of the memory cell in accordance with the embodiment of the present invention and an energy band of a memory cell in accordance with a second comparative example. The energy band of the memory cell in accordance with the present embodiment is indicated by a thin solid line, the energy band of the memory cell in accordance with the second comparative example is indicated by a dotted line, and an overlapping portion therebetween is indicated by a thick solid line.

Referring to FIG. 3, the memory cell in accordance with the present embodiment is substantially the same as described with reference to FIG. 2. In contrast, the memory cell in accordance with the second comparative example uses an air layer having the same thickness, as the tunnel insulating layer Tox. In other words, the thickness of the tunnel insulating layer Tox in accordance with the present embodiment, that is, the sum of the air layer and the oxide layer may correspond to such a thickness that direct tunneling of charges does not occur, and may be substantially equal to the thickness of the tunnel insulating layer Tox in the memory cell in accordance with the second comparative example, that is, the thickness of the air layer.

Referring to FIG. 3, it can be seen that, during the erase operation, the de-trap efficiency of electrons in the memory cell in accordance with the second comparative example (refer to) is lower than the de-trap efficiency of electrons in the memory cell in accordance with the present exemplary implementation (refer to ③). However, the erase operation in the memory cell in accordance with the second comparative example may be performed only through electron de-trap. As described above, the thickness of the air layer serving as the tunnel insulating layer Tox of the memory cell in accordance with the second comparative example corresponds to such a thickness that direct tunneling of charges does not occur, and hole injection caused by tunneling of holes does not occur because the air has no valance band.

Thus, the memory cell in accordance with the second comparative example has lower erase speed than the memory cell in accordance with the present embodiment.

Figure 4:
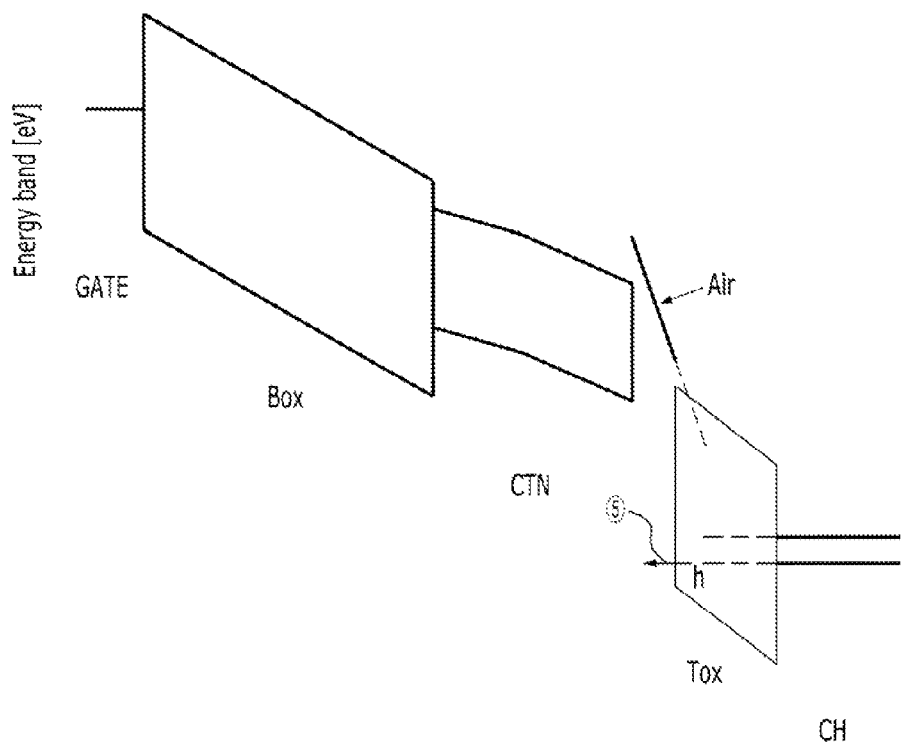
FIG. 4 is a diagram illustrating the energy band of the memory cell in accordance with the embodiment of the present invention and an energy band of a memory cell in accordance with a third comparative example.

FIG. 4 is a diagram illustrating the energy band of the memory cell in accordance with the embodiment of the present invention and an energy band of a memory cell in accordance with a third comparative example. The energy band of the memory cell in accordance with the present embodiment is indicated by a thin solid line, the energy band of the memory cell in accordance with the third comparative example is indicated by a dotted line, and an overlapping portion therebetween is indicated by a thick solid line.

Referring to FIG. 4, the memory cell in accordance with the present embodiment may be substantially the same as described with reference to FIG. 2. In contrast, the memory cell in accordance with the third comparative example uses only an air layer as the tunnel insulating layer Tox. In particular, in order to secure the same erase speed as the memory cell in accordance with the present embodiment, the tunnel insulating layer Tox of the memory cell in accordance with the third comparative example may have a smaller thickness than the tunnel insulating layer Tox of the memory cell in accordance with the present embodiment. For example, if the air layer and the oxide layer forming the tunnel insulating layer Tox in the memory cell in accordance with the present embodiment have a thickness of about 10 Å and 25 Å, respectively, then the thickness of the air layer, at which the memory cell in accordance with the third comparative example may secure the same erase speed, may correspond to about 17 Å.

When the thickness of the tunnel insulating layer Tox in the memory cell in accordance with the third comparative example is reduced, the erase speed may be improved. This is because the de-trap efficiency of electrons may be increased and direct tunneling of holes h may occur (refer to ⑤). In this case, however, the degradation of data retention characteristic inevitably occurs and the program operation based on the ISPP method may not be performed.

Thus, the memory cell in accordance with the present embodiment may have an excellent data retention characteristic and perform a program operation based on the ISPP method, compared to the memory cell in accordance with the third comparative example.

In short, when a double layer of air and oxide is used as the tunnel insulating layer like the memory cell in accordance with the present embodiment, the erase speed may be increased more than when a monolayer of oxide or air having the same thickness is used. Furthermore, when the same erase speed as the monolayer layer of oxide or air is used as the tunnel insulating layer may be secured, the thickness of the tunnel insulating layer may be increased more than the monolayer layer of oxide or air. Thus, the data retention characteristic may be secured, and the program operation based on the ISPP method may be performed, FIGS. 5A to 5E are cross-sectional views showing a semiconductor device and a method of fabricating the same in accordance with another embodiment of the present invention. The following descriptions will be focused on differences from the above-described embodiment.

Figure 5A:
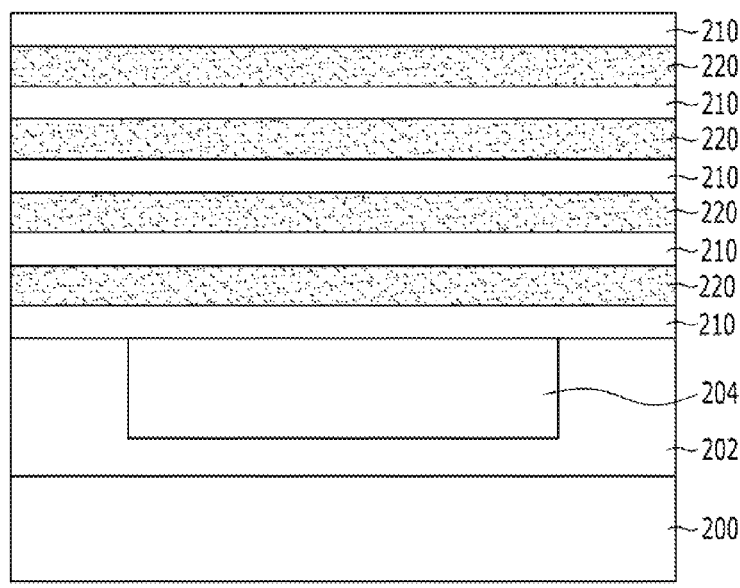
FIGS. 5A to 5E are cross-sectional views showing semiconductor device and a method of fabricating the same in accordance with another embodiment of the present invention.

Referring to FIG. 5A, a conductive layer 202 having one or more third sacrificial layers 204 buried therein may be formed over a substrate 200 in which required predetermined lower structures, for example, an uppermost insulating layer and the like may be formed.

The third sacrificial layer 204 serves to provide a space in which a pair of channels (to be described below) are coupled to each other, and may be formed of various materials that have a different etch rate from the interlayer dielectric layer 210 and the first sacrificial layer 220 and that may be easily removed.

The third sacrificial layer 204 may have an island shape when seen from the top. Although not illustrated, a plurality of third sacrificial layers 204 may be arranged in the cross-sectional direction of FIG. 5A and a direction crossing the cross-sectional direction.

The conductive layer 202 may be formed of various conductive materials including a metal, a metal oxide, polysilicon doped with an impurity, or a combination thereof. In the present embodiment, the conductive layer 202 may have a plate shape when seen from the top, and may be formed to surround the side and bottom of the third sacrificial layer 204. However, the present invention is not limited thereto. The conductive layer 202 may include any additional structures so long as the conductive layer 202 is contacted with at least a part of the third sacrificial layer 204. Alternatively, the conductive layer 202 may be omitted.

A plurality of interlayer dielectric layers 210 and a plurality of first sacrificial layers 220 may be alternately stacked over the third sacrificial layer 204 and the conductive layer 202.

Figure 5B:
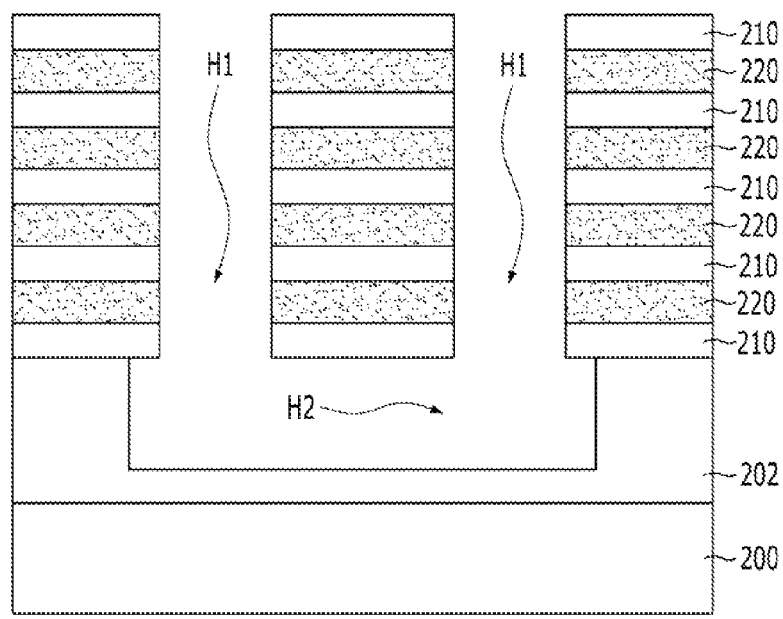

Referring to FIG. 5B the stacked structure of the interlayer dielectric layers 210 and the first sacrificial layers 220 may be selectively etched to form a pair of first channel holes H1 that expose the third sacrificial layer 204 through the stacked structure. The first channel holes H1 may extend in a direction substantially perpendicular to the substrate 100.

As the third sacrificial layer 204, which is exposed by the first channel hole H1, is removed through a wet etching process or the like, a second channel hole H2, corresponding to the space formed by the removal of the third sacrificial layer 204, may be formed. The second channel hole H2 may serve to couple the pair of first channel holes H1 at the bottom of the first channel holes H1. Through this process, a U-shaped channel hole may be formed (refer to H1 and H2).

Figure 5C:
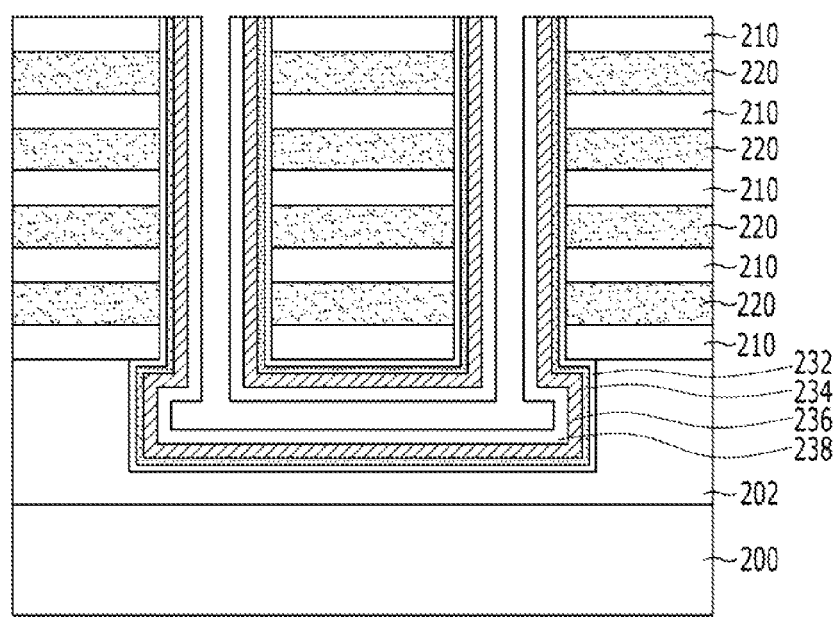

Referring to FIG. 5C, a charge blocking layer 232, a charge storing layer 234, a second sacrificial layer 236, and a first insulating layer 238 may be sequentially formed along the inner walls of the first and second channel holes H1 and H2.

The charge blocking layer 232, the charge storing layer 234, the second sacrificial layer 236, and the first insulating layer 238 may be formed by sequentially depositing an oxide layer, a nitride layer, a carbon layer, and an oxide layer over the resultant structure of FIG. 5B and performing a planarization process, for example, a CMP process, to expose the uppermost interlayer dielectric layer 210.

Figure 5D:
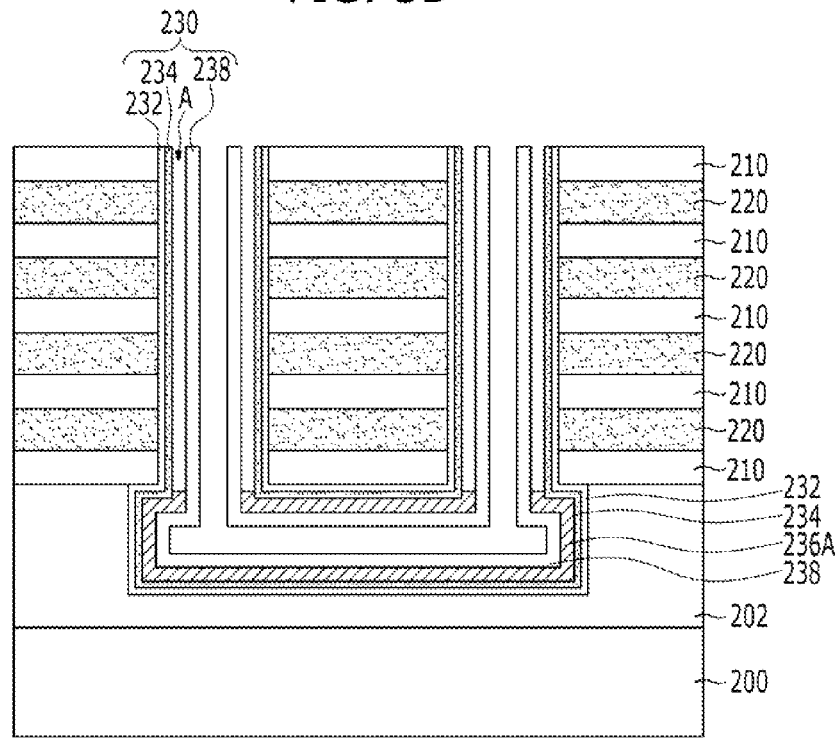

Referring to FIG. 5D, a part of the second sacrificial layer 236 may be removed to be an air layer A. The second sacrificial layer 236 of which the part is removed will be hereafter referred to as a second sacrificial layer pattern 236A.

The second sacrificial layer pattern 236A may be not completely removed such that the second sacrificial layer pattern 236A is positioned under at least the bottom of the lowermost first sacrificial layer 220. If the second sacrificial layer 236 is a carbon layer, then a plasma injection time during which oxygen-containing plasma is injected may be adjusted such that at least a part of the second sacrificial layer 236 is left while the top of the second sacrificial layer pattern 236A is set to a lower level than the bottom of the lowermost first sacrificial layer 220.

Thus, a memory layer 230, in which the charge blocking layer 232, the charge storing layer 234, the air layer A, and the first insulating layer 238 are sequentially disposed, may be formed between the first sacrificial layer 220 and the channel. The air layer A and the first insulating layer 238 may function as a tunnel insulating layer in the memory layer 230. The second sacrificial layer 236A may contact the lower part of the charge storing layer 234 and the lower part of the first insulating layer 238 in a region where the first sacrificial layer 220 does not exist. For example, a region where the second sacrificial layer 236A contacts the conductive layer 202, thereby supporting the first insulating layer 238 and maintaining the air layer A.

Figure 5E:
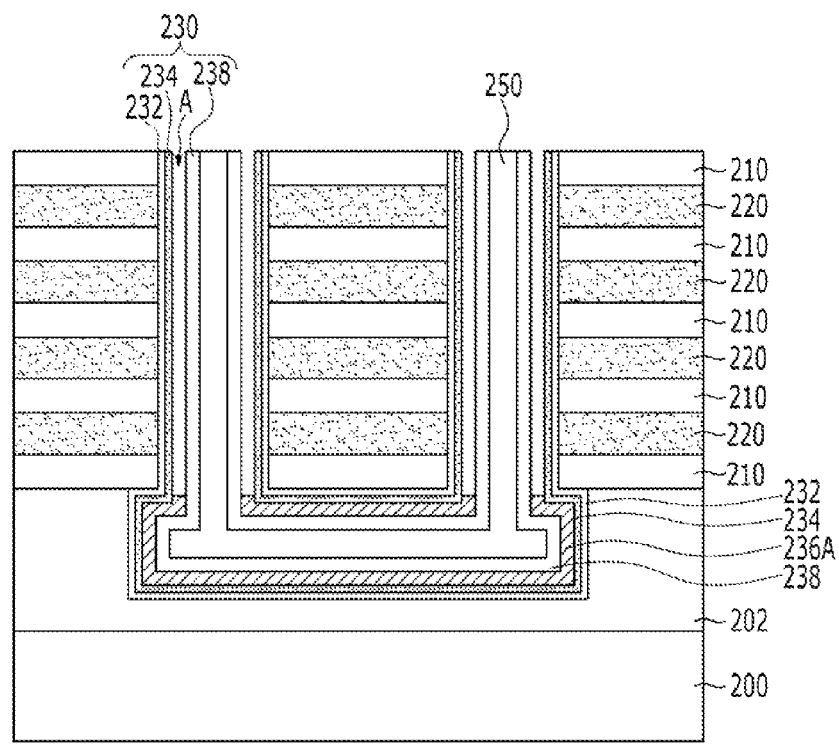

Referring to FIG. 5E, a semiconductor material is buried in the first and second channel holes H1 and H2, which have the memory layer 230 formed therein, thereby forming a channel 250. The channel 250 may include a pair of pillar parts extending in a direction substantially perpendicular to the substrate 200 and may include a coupling part to couple the pair of pillar parts at the bottom of the pair of pillar parts. Thus, the channel 250 may have a U-shape.

Although not illustrated, a process similar to that described with reference to FIGS. 1E and 1F may be performed to replace the first sacrificial layer 220 with a gate. In this case, a plurality of memory cells each including the gate, the charge blocking layer 232, the charge storing layer 234, the air layer A, the first insulating layer 238, and the channel 250 may be formed as illustrated in FIG. 1F. The plurality of memory cells may be stacked over the substrate 100. Under the plurality of memory cells, a pipe transistor to control the coupling between the pair of pillar parts of the channel 250 may be disposed. The pipe transistor may include the conductive layer 202 serving as the gate, the coupling part of the channel 250, and the gate dielectric layer interposed therebetween and including the charge blocking layer 232, the charge storing layer 234, the air layer A or the second sacrificial layer pattern 236A, and the first insulating layer 238.

Although not illustrated, required subsequent processes, for example, a process of forming a bit line to be coupled to any one of the tops of the pair of pillar parts of the channel 250 and a process of forming a source line to be coupled to the other one of the tops of the pair of pillar parts of the channel 250 may be additionally performed, The semiconductor device in accordance with the present embodiment is similar to the above-described embodiment, except that the U-shaped memory string is formed. Thus, the semiconductor device may secure the same as or similar effect to the above-described embodiment.

In the above-described embodiments, it has been described that the channel fills the entire portion of the channel hole having the memory layer formed therein. However, the present invention is not limited thereto. In an alternative implementation, the channel may fill only a part of the channel hole. This will be described below with reference to FIG. 6.

Figure 6:
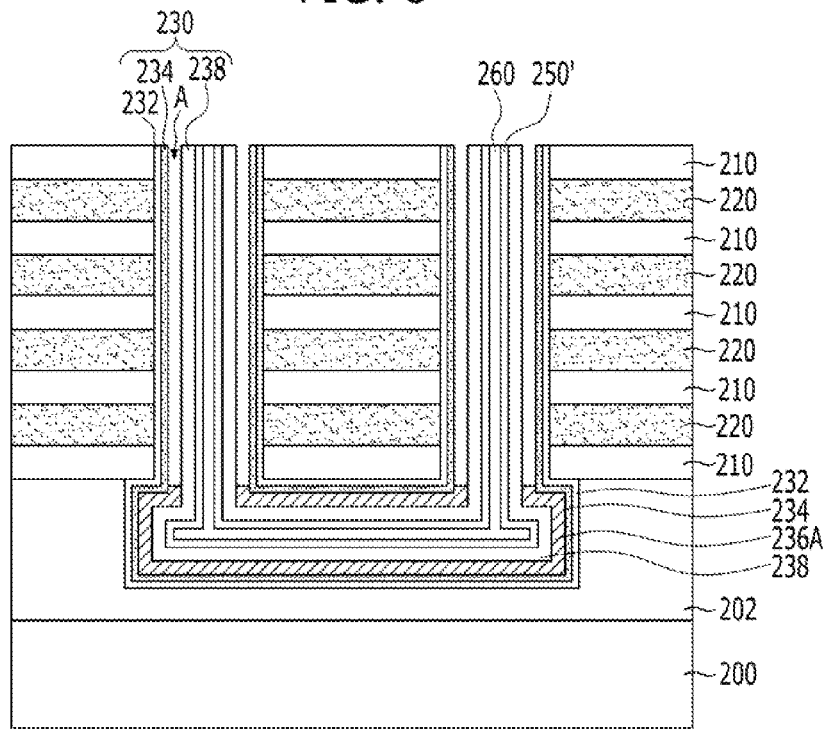
FIG. 6 is a cross-sectional view showing a semiconductor device in accordance with another embodiment of the present invention.

FIG. 6 is a cross-sectional view showing a semiconductor device in accordance with another embodiment of the present invention.

Referring to FIG. 6, a channel 250' in accordance with the present embodiment may be formed on the memory layer 230 to such a thickness that the channel holes having the memory layer 230 formed therein (refer to H1 and H2 of FIG. 5B) are not completely filled. The other space of the channel hole having the memory layer 230 and the channel 250' formed therein may be filled with an insulating layer 260, such as an oxide layer or a nitride layer.

With respect to FIGS. 5A to 5E, it has been described that a part of the second sacrificial layer 236 is left to support the first insulating layer 238 and maintain the air layer A. However, the present invention is not limited thereto. For example, in an alternative implementation, the support layer for the first insulating layer 238 and the air layer A may be formed in various shapes through various methods. This will be described below with reference to FIGS. 7 to 9.

Figure 7:
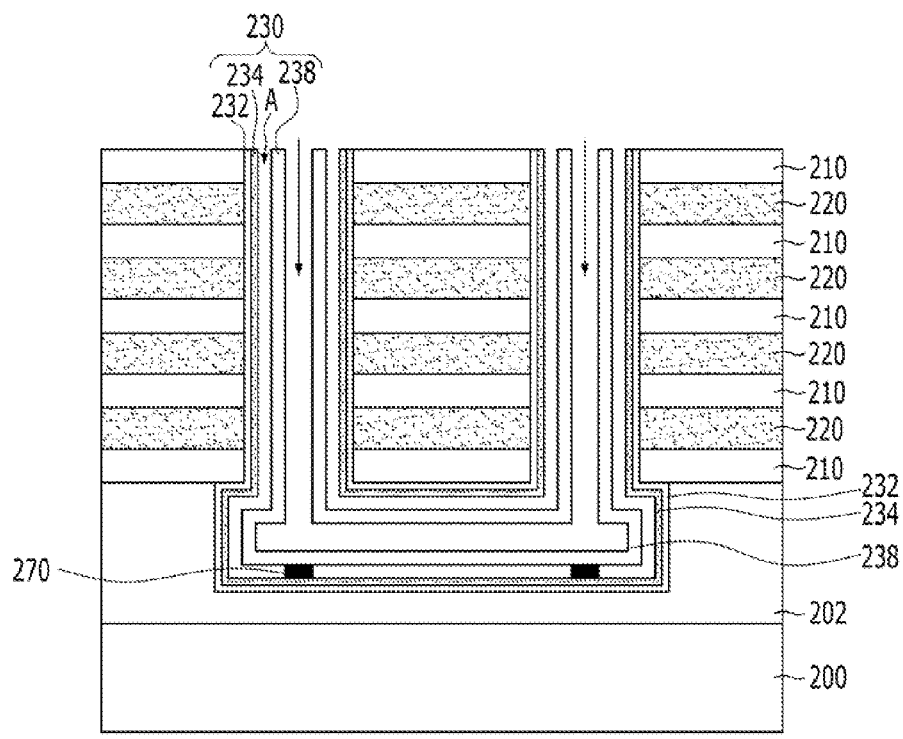
FIG. 7 is a cross-sectional view showing a semiconductor device and a method for fabricating the same in accordance with an embodiment of the present invention.

FIG. 7 is a cross-sectional view showing a semiconductor device and a method of fabricating the same in accordance with another embodiment of the present invention.

First, the processes of FIGS. 5A to 5C are performed.

Referring to FIG. 7, a thermal oxidation process may be performed on the resultant structure of FIG. 5C, and the entire part of the second sacrificial layer 236 may be removed to form an air layer A. In this case, the second sacrificial layer 236 may be formed of a material that is heated and removed, such as a carbon layer.

During the thermal oxidation process, a bias power may be applied from upward to downward in a direction substantially perpendicular to the substrate 200 (refer to the arrow of FIG. 7). If the first insulating layer 238 is formed of an oxide layer that is not dense, then an oxidation gas may pass through the first insulating layer 238 in a region corresponding to the first channel hole extending in the vertical direction (refer to H1 of FIG. 5B), and then oxidize at least a part of the charge storing layer 234. If the charge storing layer 234 is formed of a layer of which the volume is expanded during oxidation (for example, a nitride layer), then an oxide layer of a material forming the charge storing layer 234 (for example, oxynitride) may be buried between the first insulating layer 238 and the charge storing layer 234 during this oxidation process. The oxide layer of the material forming the charge storing layer 234 maybe contacted with the charge storing layer 234 and the first insulating layer 238 in the region corresponding to the first channel hole, thereby supporting the first insulating layer 238 and the air layer A. Thus, the oxide layer is referred to as a support layer 270.

FIG. 7 illustrates a case in which a part of the charge storing layer 234 is oxidized in the region corresponding to the first channel hole, but the present embodiment is not limited thereto. For example, in an alternative implementation, the entire charge storing layer 234 may be oxidized in the corresponding region. In this case, the bottom of the support layer 270 may be contacted with the charge blocking layer 232 in the corresponding region.

Since a channel formation process and a gate formation process that may be subsequently performed are substantially the same as described above, the detailed descriptions thereof are omitted herein.

Figure 8A:
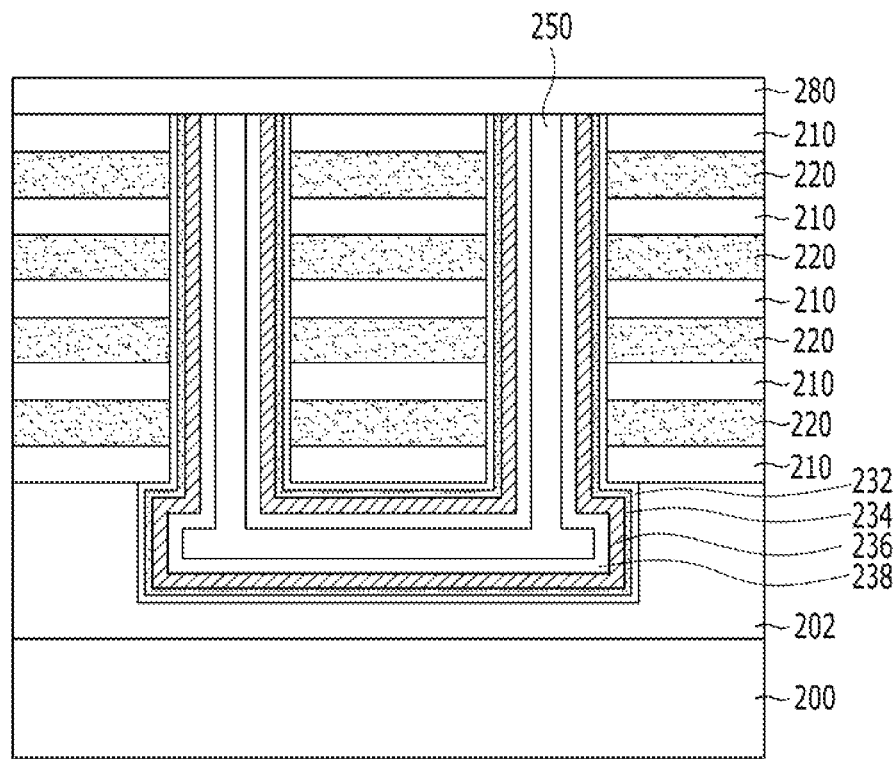
FIGS. 8A to 9 are diagrams showing a semiconductor device and a method for fabricating the same in accordance with an embodiment of the present invention.
Figure 8B:
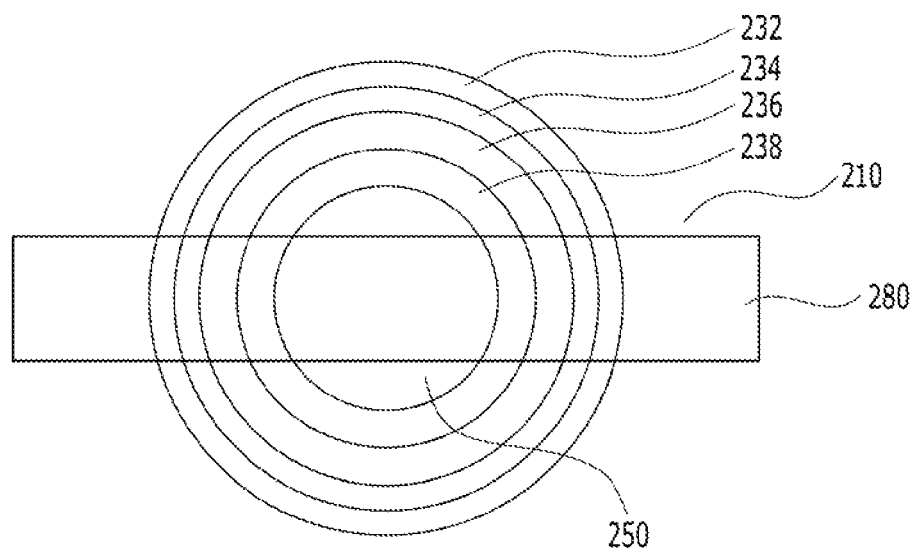
Figure 9:
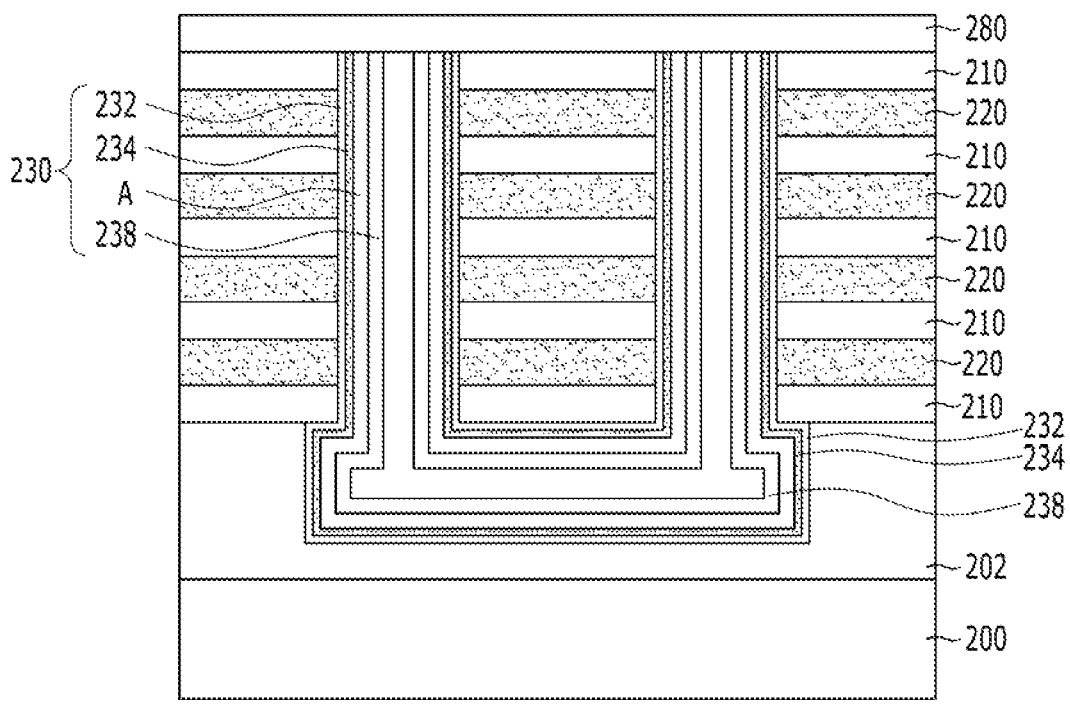

FIGS. 8A to 9 are diagrams showing a semiconductor device and a method of fabricating the same in accordance with another embodiment of the present invention. In particular, FIGS. 8A and 9 are cross-sectional views, and FIG. 88 is a plan view based on one first channel hole of FIG. 8A.

First, the processes of FIGS. 5A to 5C are performed.

Referring to FIGS. 8A and 88, a channel 250 may be formed in the channel holes (refer to H1 and H2 of FIG. 5B), and a support layer 280 may be formed over the resultant structure. The support layer 280 may be formed of an insulating material such as oxide or nitride.

The support layer 280 may be contacted with the top surfaces of the charge blocking layer 232, the charge storing layer 234, the second sacrificial layer 236, the first insulating layer 238, the channel 250, and the uppermost interlayer dielectric layer 210 across the first channel hole H1, when seen from the top. At this time, the support layer 280 may have a width that does not completely cover the first channel hole, and may expose at least a part of the top surface of the second sacrificial layer 236.

Referring to FIG. 9, the entire part of the second sacrificial layer 236 exposed by the support layer 280 may be removed through oxygen plasma or the like, to form an air layer A. Although the entire part of the second sacrificial layer 236 is removed, the support layer 280 may be contacted with the top surface of the first insulating layer 238 so as to support the first insulting layer 238. Thus, the air layer A between the first insulating layer 238 and the charge storing Mayer 234 may be maintained.

Since a subsequent gate formation process is substantially the same as described above, the detailed descriptions thereof are omitted herein.

In accordance with the embodiments of the present invention, it is possible to secure the operation characteristic and the data retention characteristic of the memory cell and simplify the fabrication process.

Although various embodiments have been described for illustrative purposes, it will be apparent to those skilled in the art that various changes and modifications may be made without departing from the spirit and scope of the invention as defined in the following claims.

What is claimed is:

1. A method of fabricating a semiconductor device, the method comprising:
   forming a stacked structure over a substrate, the stacked structure including a plurality of interlayer dielectric layers and a plurality of material layers, which are alternately stacked;
   selectively etching the stacked structure to form a first channel hole through the stacked structure;
   sequentially forming a charge blocking layer, a charge storing layer, a second sacrificial layer, and a first insulating layer on a sidewall defining the first channel hole;
   forming an air layer by removing the second sacrificial layer; and
   forming a channel in the first channel hole.

2. The method of claim 1, wherein the forming the second sacrificial layer and the forming a first insulating layer comprises:
   forming the second sacrificial layer and the first insulating layer to a thickness that prevents direct tunneling of a charge.

3. The method of claim 1, wherein the second sacrificial layer is formed of carbon.

4. The method of claim 3, wherein the forming an air layer comprises:
   removing the second sacrificial layer using an oxygen-containing plasma.

5. The method of claim 1, wherein the first channel hole include a pair of first channel holes, and
   the method further comprising, before the forming the stacked structure:
   forming a second conductive layer on the substrate; and
   forming a third sacrificial layer in the second conductive layer; and
   the method further comprising, after the forming the first channel hole:
   forming a second channel hole by removing the third sacrificial layer which is exposed by the pair of first channel holes.

6. The method of claim 5, wherein the charge blocking layer, the charge storing layer, the second sacrificial layer, and the first insulating layer are sequentially formed on an inner wall of the second channel hole.

7. The method of claim 6, wherein the forming an air layer further comprises:
   not removing at least a part of the second sacrificial layer facing the second conductive layer.

8. The method of claim 6, wherein the second sacrificial layer is formed of a material that is removed by heat,
   the charge storing layer is formed of a material that undergoes a volume increase when oxidized, and
   the forming an air layer comprises:
   thermally oxidizing the second sacrificial layer in a state where a bias power is applied from upward to downward to remove the second sacrificial layer.

9. The method of claim 6, further comprising:
   forming, over the stacked structure, a support layer crossing the first channel hole and exposing a part of the top surface of the second sacrificial layer, before the forming an air layer.

* * * * *